United States Patent
Lionetta et al.

(10) Patent No.: US 7,326,862 B2
(45) Date of Patent: *Feb. 5, 2008

(54) COMBINATION METAL AND PLASTIC EMI SHIELD

(75) Inventors: William G. Lionetta, Winchester, MA (US); Louis M. Yantosca, Jr., Westford, MA (US); Daniel S. Ventura, Newbury, MA (US); Robert E. Stiffler, Westford, MA (US); David C. Rich, Framingham, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 196 days.

This patent is subject to a terminal disclaimer.

(21) Appl. No.: 10/764,956

(22) Filed: Jan. 26, 2004

(65) Prior Publication Data

US 2004/0165369 A1    Aug. 26, 2004

Related U.S. Application Data

(60) Provisional application No. 60/469,250, filed on May 9, 2003, provisional application No. 60/447,263, filed on Feb. 13, 2003.

(51) Int. Cl.
*H05K 9/00* (2006.01)
*H01R 4/38* (2006.01)

(52) U.S. Cl. .................... 174/370; 174/388; 174/384; 174/387

(58) Field of Classification Search .............. 174/35 R, 174/35 GC, 35 MS, 36 R, 384, 387, 388, 174/370; 361/816, 818, 800
See application file for complete search history.

(56) References Cited

U.S. PATENT DOCUMENTS

| | | | |
|---|---|---|---|
| 3,721,746 A | | 3/1973 | Knappenberger |
| 3,816,911 A | * | 6/1974 | Knappenberger ............ 29/841 |
| 4,218,578 A | | 8/1980 | Olschewski et al. |
| 4,370,515 A | | 1/1983 | Donaldson |
| 4,559,262 A | | 12/1985 | Cogswell et al. |
| 4,594,644 A | | 6/1986 | Paintor |

(Continued)

FOREIGN PATENT DOCUMENTS

DE    32 33 621    1/1984

(Continued)

OTHER PUBLICATIONS

CHO-VER SHIELD™ Shielding Plastic Cover with Molded Conductive Elastomeric Gasket (1999).

(Continued)

*Primary Examiner*—Hung V. Ngo
(74) *Attorney, Agent, or Firm*—John A. Molnar, Jr.

(57) ABSTRACT

An EMI shield having at least one compartment for enclosing circuitry of an electronic device. The shield includes a first member formed of a thin metal sheet, and a second member formed of an electrically-conductive composite material comprising an admixture of a plastic or other polymeric component and an electrically-conductive particulate filler component. The second member is integrally joined to the first member, and has at least one wall which extends from the first member and which together with the first member defines at least a portion of the compartment.

38 Claims, 6 Drawing Sheets

U.S. PATENT DOCUMENTS

| | | |
|---|---|---|
| 4,664,971 A | 5/1987 | Soens |
| 4,714,623 A | 12/1987 | Riccio et al. |
| 4,739,453 A | 4/1988 | Kurokawa |
| 4,754,101 A | 6/1988 | Stickney et al. |
| 4,816,184 A | 3/1989 | Fukuda et al. |
| 4,831,498 A | 5/1989 | Baba |
| 4,857,668 A | 8/1989 | Buonanno |
| 4,912,604 A | 3/1990 | Vaisanen |
| 4,952,448 A | 8/1990 | Bullock |
| 4,973,514 A | 11/1990 | Gamble et al. |
| 5,006,667 A | 4/1991 | Lonka |
| 5,014,160 A | 5/1991 | McCoy, Jr. |
| 5,019,450 A | 5/1991 | Cogswell et al. |
| 5,043,848 A | 8/1991 | Rogers et al. |
| 5,047,260 A | 9/1991 | Durand |
| 5,053,924 A | 10/1991 | Kurgan |
| 5,105,056 A | 4/1992 | Hoge, Jr. et al. |
| 5,137,766 A | 8/1992 | Mazanek et al. |
| 5,142,101 A | 8/1992 | Matsuzaki et al. |
| 5,150,282 A | 9/1992 | Tomura et al. |
| 5,160,807 A | 11/1992 | Fry et al. |
| 5,170,009 A | 12/1992 | Kadokura |
| 5,175,395 A | 12/1992 | Moore |
| 5,180,639 A | 1/1993 | Zarnoch |
| 5,202,536 A | 4/1993 | Buonanno |
| 5,213,889 A | 5/1993 | Cogswell et al. |
| 5,252,782 A | 10/1993 | Cantrell et al. |
| 5,271,056 A | 12/1993 | Pesola et al. |
| 5,317,107 A | 5/1994 | Osorio |
| 5,323,299 A | 6/1994 | Weber |
| 5,353,201 A | 10/1994 | Maeda |
| 5,354,951 A | 10/1994 | Lange, Sr. et al. |
| 5,366,664 A | 11/1994 | Varadan et al. |
| 5,397,608 A | 3/1995 | Soens |
| 5,397,857 A | 3/1995 | Farquhar et al. |
| 5,400,949 A | 3/1995 | Hirvonen et al. |
| 5,416,668 A * | 5/1995 | Benzoni ............... 361/816 |
| 5,436,802 A | 7/1995 | Trahan et al. |
| 5,442,153 A | 8/1995 | Marantz et al. |
| 5,473,111 A | 12/1995 | Hattori et al. |
| 5,475,919 A | 12/1995 | Wu et al. |
| 5,495,399 A | 2/1996 | Gore et al. |
| 5,548,084 A | 8/1996 | Tracy |
| 5,557,063 A | 9/1996 | Mottahed |
| 5,566,055 A | 10/1996 | Salvi, Jr. |
| 5,571,991 A | 11/1996 | Highum et al. |
| 5,608,188 A | 3/1997 | Choon et al. |
| 5,633,786 A | 5/1997 | Matuszewski et al. |
| 5,660,380 A | 8/1997 | Reis et al. |
| 5,684,340 A | 11/1997 | Soler et al. |
| 5,704,117 A | 1/1998 | Mok et al. |
| 5,717,577 A | 2/1998 | Mendolia et al. |
| 5,724,234 A | 3/1998 | Phelps |
| 5,742,488 A | 4/1998 | Lonka et al. |
| 5,811,050 A | 9/1998 | Gabower |
| 5,838,551 A | 11/1998 | Chan |
| 5,847,317 A | 12/1998 | Phelps |
| 5,895,884 A | 4/1999 | Davidson |
| 6,048,919 A | 4/2000 | McCullough |
| 6,051,779 A | 4/2000 | Gammon |
| 6,090,728 A | 7/2000 | Yenni, Jr. et al. |
| 6,121,546 A | 9/2000 | Erickson et al. |
| 6,136,131 A | 10/2000 | Sosnowski |
| 6,166,918 A | 12/2000 | Olofsson et al. |
| 6,178,318 B1 | 1/2001 | Holmberg et al. |
| 6,256,878 B1 | 7/2001 | Keane |
| 6,348,654 B1 | 2/2002 | Zhang et al. |
| 6,431,884 B1 | 8/2002 | Wallace et al. |
| 6,541,698 B2 * | 4/2003 | Miska ............... 174/35 GC |

FOREIGN PATENT DOCUMENTS

| | | |
|---|---|---|
| DE | 295 15 035 | 2/1996 |
| DE | 195 09 553 | 7/1998 |
| DE | 197 28 839 | 9/1998 |
| EP | 0 407 072 | 9/1994 |
| EP | 0 702 512 | 3/1996 |
| EP | 0 726 700 | 8/1996 |
| EP | 0 781 085 | 6/1997 |
| EP | 0 805 619 A1 | 11/1997 |
| EP | 0 729 294 | 9/1998 |
| EP | 0 820 218 | 1/1999 |
| EP | 0 936 045 | 8/1999 |
| EP | 0 963 148 | 12/1999 |
| EP | 0 993 244 | 4/2000 |
| EP | 1 061 789 | 12/2000 |
| EP | 0 805 619 B1 | 1/2001 |
| EP | 1 148 774 | 10/2001 |
| EP | 0 940 068 | 2/2002 |
| JP | 10 322076 | 12/1998 |
| JP | 6-338696 | 9/2000 |
| WO | WO 97/26782 | 7/1997 |
| WO | WO 98/08364 | 2/1998 |
| WO | WO 98/08365 | 2/1998 |
| WO | WO 98/19509 | 5/1998 |
| WO | WO 98/47340 | 10/1998 |
| WO | WO 98/54942 | 12/1998 |
| WO | WO 99/40769 | 8/1999 |
| WO | WO 99/43191 | 8/1999 |
| WO | WO 00/29635 | 5/2000 |
| WO | WO 00/48441 | 8/2000 |
| WO | WO 00/52981 | 9/2000 |
| WO | WO 01/97583 | 12/2001 |
| WO | WO 02/02686 | 1/2002 |
| WO | WO 02/43456 | 5/2002 |

OTHER PUBLICATIONS

Chomerics Conductive Elastomers—Molded-in-Place Cover Seals. Applicants request the Examiner to consider this reference as prior art under 102(a), however, Applicants respectfully reserve the right to supplement this Information Disclosure Statement and take a contrary position should it be necessary.

Chomerics Shielding Solutions for Wireless Communcations—EMI Shielding/Grounding Spacer Gaskets. Applicants request the Examiner to consider this reference as prior art under 102 (a), however, Applicants respectfully reserve the right to supplement this Information Disclosure Statement and take a contrary position should it be necessary.

"CHO-SHIELD® Conductive Compounds;" "CHO-SHIELD® EMI Shielding Covers," Technical Bulletin 22, (1996).

"CHO-SHIELD® 2052 Conductive Coating," Technical Bulletin 48, (2000.).

"CHO-SHIELD® 2054 Waterborne Conductive Coating," Preliminary Product Data Sheet, (2000).

"CHO-SHIELD® 2056 High Performance Conductive Coating," Preliminary Product Data Sheet.

The International Search Report and Written Opinion of the International Searching Authority in corresponding International Application No. PCT/US2004/001936.

Notification of Transmittal of the International Search Report and the Written Opinion of the International Search Authority, or the Declaration in corresponding International Application No. PCT/US2004/004225.

\* cited by examiner

COMBINATION METAL AND PLASTIC EMI SHIELD

CROSS-REFERENCE TO RELATED CASES

The present application claims the benefit of the filing date of U.S. Provisional Application Ser. No. 60/447,263; filed Feb. 13, 2003, and U.S. Provisional Application Ser. No. 60/469,250; filed May 9, 2003, the disclosures of which are expressly incorporated herein by reference.

BACKGROUND OF THE INVENTION

The present invention relates broadly to electromagnetic interference (EMI) shields, such as cases, housings, or parts thereof such as covers, or board-level shields such as single or multi-compartment covers or "cans," for mobile, i.e., cellular telephone handsets, telecommunication base stations, and other electronic devices, and particularly to a shield having a thin metal base portion to which is joined a wall portion formed of a conductive plastic or other polymeric material that may be molded or otherwise formed into a myriad of shapes.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is interposed between the source and the other devices, and typically is configured as an electrically conductive and grounded housing which encloses the device, or as a "can" which covers a discrete component or componentry of the device. The housing or can may be formed of a metal such as steel, aluminum, or magnesium, or alternatively, of a plastic or other polymeric material which is filled to be electrically-conductive, such as is described in U.S. Pat. Nos. 5,397,608; 5,366,664; 5,213,889; 5,137,766; 5,019,450; 4,973,514; 4,816,184; 4,664,971; and 4,559,262, and in WO 02/43456 and 02/02686, or which may be provided with a conductive coating generally applied across the interior surfaces of the housing.

The coating may be an electrically-conductive paint, a conductively-filled, molded elastomeric layer, a metal foil laminate or transfer, or a flame-sprayed or other deposited metal layer. A conductive gasket may be used to provide electrical continuity between the coating layers applied to the various mating housing parts.

Such housings, cans, and methods are further described in commonly-assigned U.S. Pat. Nos. 6,348,654 and 5,566,055, U.S. 20030015334, and WO 02/093997 and 02/093996, and in U.S. Pat. Nos. 6,431,884; 6,256,878; 6,090,728; 5,847,317; 5,811,050; 5,571,991; 5,475,919; 5,473,111; 5,442,153; 5,397,857; 5,180,639; 5,170,009; 5,150,282; 5,047,260; and 4,714,623, WO 02/43456; 01/97583; 00/29635; 99/43191; 99/40769; 98/54942; 98/47340; and 97/26782, EP 1,148,774; 0,936,045; and 0,940,068, and DE 19728839, and in the following publications of the Chomerics Division of Parker Hannifin Corporation (Woburn, Mass.): "CHO-SHIELD® Conductive Compounds;" "CHO-SHIELD® EMI Shielding Covers," Technical Bulletin 22, (1996); "CHO-VER SHIELD™ EMI Shielding Plastic Cover with Molded Conductive Elastomeric Gasket," (1999); "CHO-SHIELD® 2052 Conductive Coating," Technical Bulletin 48, (2000); "CHO-SHIELD® 2054 Conductive Coating," Preliminary Product Data Sheet, (2000); and "CHO-SHIELD® 2056 High Performance Conductive Coating," Preliminary Product Data Sheet.

In view of the foregoing, it may be appreciated that many different types of materials and constructions have been employed in the production of EMI shields. As may be expected, each of these materials and constructions exhibit certain inherent advantages and disadvantages. For example, stamped aluminum shield constructions are widely known and can be fabricated having very thin wall, i.e., z-axis, thicknesses of 0.2 mm or less, but are relatively expensive and difficult to fabricate in a cost-effective manner into the complex shapes which may be required for certain applications. Likewise, conductively-filled plastics may be economically molded or otherwise formed into a variety of complex shapes, but generally cannot be used in shielding applications where very thin wall thicknesses are required in certain sections of the shield.

As electronic devices such as mobile phone handsets continue to proliferate, it is believed that additional EMI shielding alternatives and options for handset cases and other enclosures would be well-received by the electronics industry.

BROAD STATEMENT OF THE INVENTION

The present invention relates broadly to electromagnetic interference (EMI) shields, such as cases, housings, or parts thereof such as covers, or board-level shields such as multi- or single-compartment covers or "cans," for mobile, i.e., cellular telephone handsets, telecommunication base stations, and other electronic devices. More particularly, the invention relates to a shield having a thin metal base section to which is joined a wall section formed of a conductively-filled plastic or other polymeric composite material that may be molded or otherwise formed into a myriad of shapes.

In an illustrative embodiment, the shield is configured as a board-level cover or can for an electronic device, and has multiple compartments for shielding the circuitry of the device. In this regard, the wall section is configured to define the multiple compartments, and may be molded, such as by means of insert molding, onto the base section to form an integral shield. The shield may be attached to the board, such as with an end surface of the wall section being in contact with a grounding trace formed on the board, using fasteners, clips, or other mechanical means. Alternatively, the shield may be soldered or adhesively bonded to the board. An electrically-conductive coating or elastomeric gasket also may be interposed between the wall section of the shield and the board to improve the electrical contact therebetween.

Advantageously, the shield of the invention allows for a more economical construction as compared to metal stampings, while offering the designer the ability to fabricate shields having complex shapes but which still offer the thinner z-axis profiles which are attainable by the use of sheet metals. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
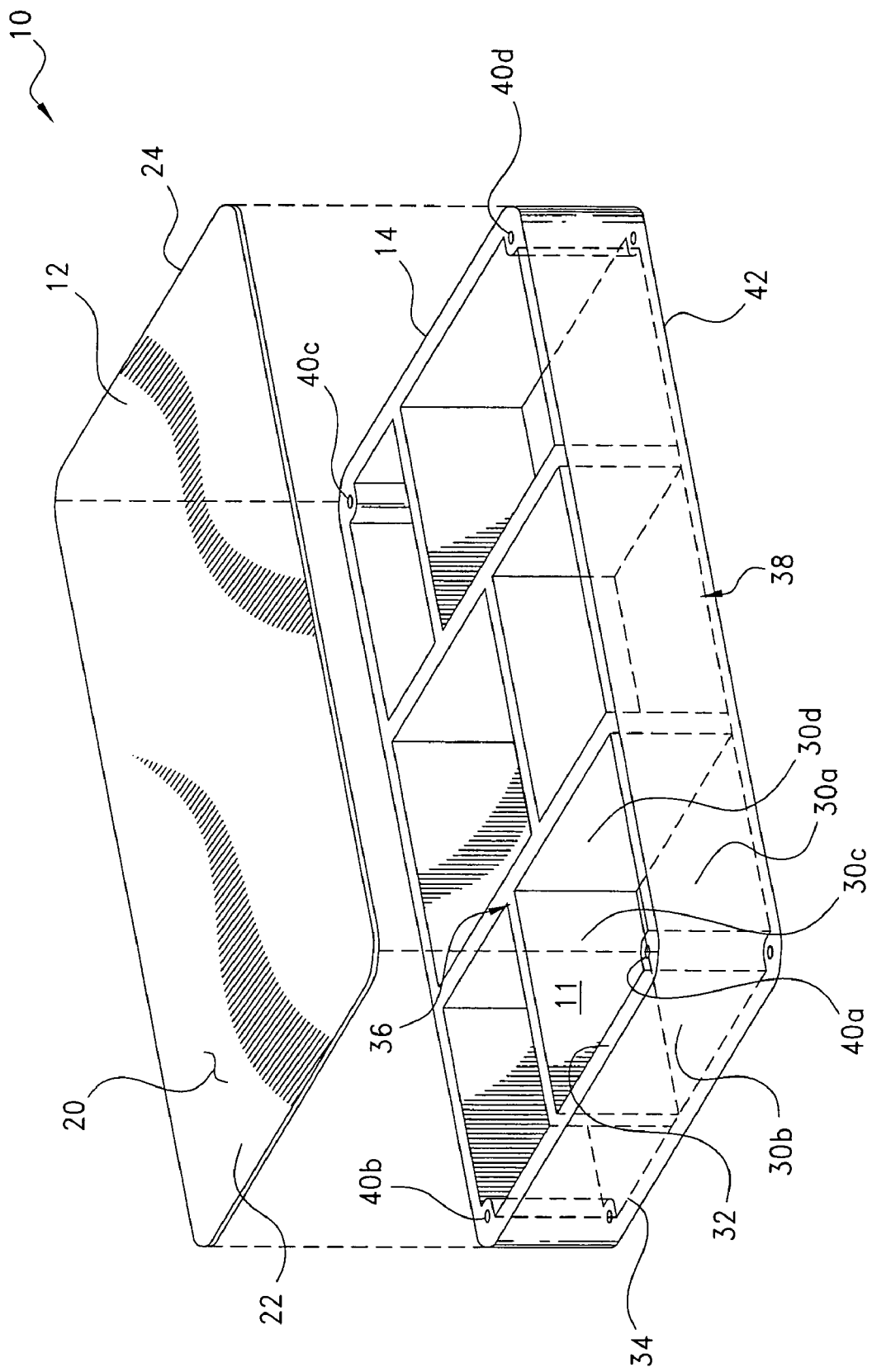
FIG. 1 is an exploded perspective view of a representative combination metal and plastic EMI shield in accordance with the present invention.

The drawings will be described further in connection with the following Detailed Description of the Invention.

DETAILED DESCRIPTION OF THE INVENTION

Certain terminology may be employed in the following description for convenience rather than for any limiting purpose. For example, the terms "forward" and "rearward," "front" and "rear," "right" and "left," "upper" and "lower," "top" and "bottom," and "right" and "left" designate directions in the drawings to which reference is made, with the terms "inward," "inner," "interior," or "inboard" and "outward," "outer," "exterior," or "outboard" referring, respectively, to directions toward and away from the center of the referenced element, the terms "radial" or "vertical" and "axial" or "horizontal" referring, respectively, to directions or planes perpendicular and parallel to the longitudinal central axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows or underscores.

For the purposes of the discourse to follow, the precepts of the present invention are described in connection with the construction of a multi-compartment combination metal and plastic cover or "can" which is mountable onto or over a PCB for enclosing various circuitry sections of the PCB which itself may be received with the shield within a housing, case, or other enclosure of an electronic device such as a mobile, i.e., cellular, telephone handset, or other electronics device such as a personal communications services (PCS) handset, PCMCIA card, global positioning system (GPS), radio receiver, personal digital assistant (PDA), notebook or desktop personal computer (PC), cordless telephone handset, network router or server, medical electronics device, modem, wirelss communication base station, telemetry device, telematic component or system, or the like. As used herein, the term "EMI shielding" should be understood to include, and to be used interchangeably with, electromagnetic compatibility (EMC), surface grounding, corona shielding, radio frequency interference (RFI) shielding, and anti-static, i.e., electro-static discharge (ESD) protection.

It should be appreciated, however, that the shield alternatively may be configured as a single compartment can, or as another cover or housing of the device, or as configured for mounting to or contact with another part of the device which may be another shield, a cover or housing part, or a spacer gasket or other structure. Aspects of the present invention also may find utility in other EMI shielding applications, such as indoor or outdoor equipment cabinets. Use within those such other applications and in such other configurations therefore should be considered to be expressly within the scope of the present invention.

Figure 2:
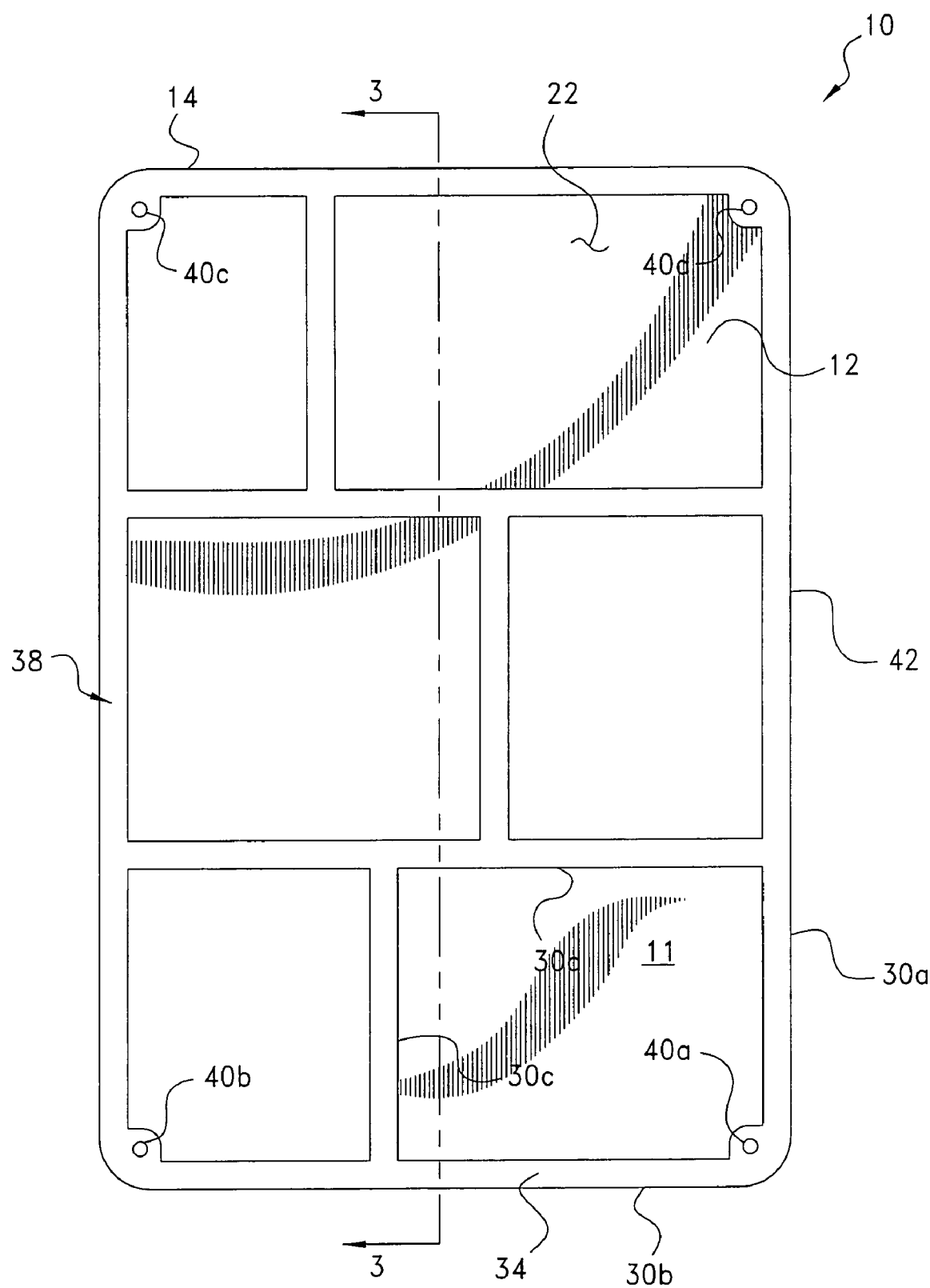
FIG. 2 is a bottom view of the shield of FIG. 1.
Figure 3:
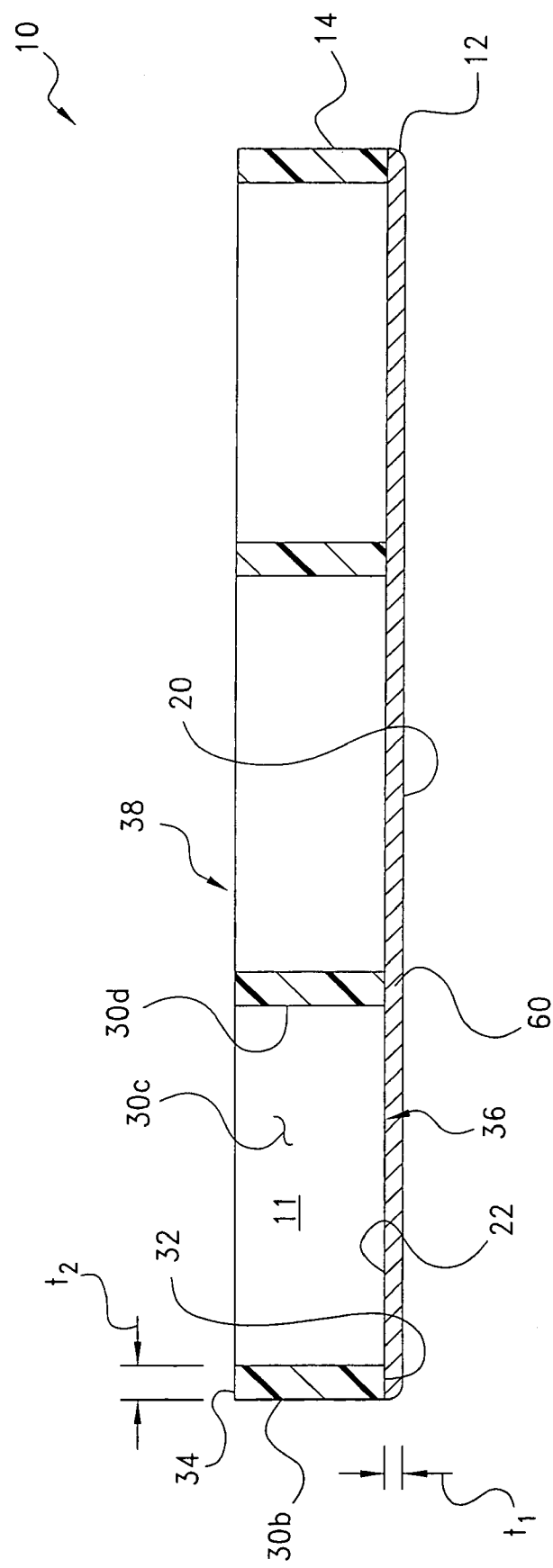
FIG. 3 is a cross-sectional view of the shield of FIG. 1 taken through line 3-3 of FIG. 2.

Referring then to the figures wherein corresponding reference characters are used to designate corresponding elements throughout the several views with equivalent elements being referenced with prime or sequential alphanumeric designations, an exemplary EMI shield in accordance with the present invention is shown generally at 10 in the several views of FIGS. 1-3 as having one or more compartments, one of which is referenced at 11, for enclosing circuitry of an electronic device. In basic construction, shield 10 includes a first member or section, 12, and a mating second member or section, 14, which is integrally joined to the first section 12, and which is configured to partition the shield 10 into the one or more compartments 11. Each of the compartments 11 may be used to house separate components, circuits, or areas of the circuitry of the device for the purpose of electromagnetically isolating the same from other such components, circuits, or areas of the circuitry.

Depending upon the requirements of the particular application involved, first section 12 may be generally planar, and in the illustrative embodiment of FIGS. 1-3 has an outer surface, 20, and an inner surface, 22. First section 12 may be stamped, die cut, or otherwise formed into a variety of shapes, which shape may be defined by an outer margin, 24, and otherwise may be provided as a thin metal sheet having a z-axis thickness, referenced at $t_1$ in the cross-sectional view of FIG. 3, of, for example, not greater than about 10 mils (0.25 mm), and, typically, between about 3-5 mils (0.075-0.125 mm) or less. Although the first section 12 is shown in FIGS. 1-3 to be generally flat, the section alternatively may be contoured or otherwise non-planar as the application may require. Typically, the first section 12 may be formed of a sheet of an aluminum or aluminum alloy material. Alternatively, a sheet of another metal, such as zinc, magnesium, or steel, or a combination or alloy thereof, may be substituted or used in combination with the aluminum or aluminum alloy material.

The second section 14 is integrally joined to the first member, and has one or more walls, a grouping of adjacent ones of which is referenced at 30a-d, which extend, either generally perpendicularly as shown or, alternatively, at an angle, from the inner surface 22 of the first section 12. As is shown for the walls 30a-d, each such grouping of adjacent walls 30, together with the surface 22 of the first member 12 may define a separate one of the compartments 11. It is to be understood that, as used herein, the term "wall" may refer to an exterior wall or portion thereof, such as is referenced at 30a and 30b, and/or to an interior wall or portion thereof, such as either of walls 30c or 30d. Typically, the walls 30 each may have a z-axis thickness, referenced at $t_2$ in the cross-sectional view of FIG. 3, which may be the same or different, and which otherwise may be between about 3-10 mils (0.075-0.254 mm).

As may be seen best with continued reference to the cross-sectional view of FIG. 3, each of the walls 30 extends intermediate a first end surface, referenced at 32 for the wall 30b, adjacent the first section inner surface 22, and a distal second end surface, referenced at 34 for wall 30b. The first end surfaces 32, which, as is shown may be generally coterminous such that the interface, referenced at 36, which is defined collectively thereby is generally planar. Alternatively, such as may depend upon the contouring of the first section 12, the first end surfaces may terminate non-planarly. Likewise, the second end surfaces 34 may terminate to define an interface, 38, which is generally planar as shown or, instead, is non-planar. The second end surface, which may be used, for example, to contact the ground trace of a PCB, may be generally flat as shown or, alternatively, rounded, notched, flanged, tapered, or otherwise shaped.

The second section 14 further may be formed as having features, such as the corner throughholes referenced at 40a-d, for the attachment using screws or other fasteners of the shield to a PCB or other part of the device. The throughholes 40 may be otherwise configured such as for pins or for heat-staked threaded metal or other inserts. Similarly, the second section 14 may be formed as having features for a snap or other interference fit or mechanical engagement with another part of the device. A flange (not shown) also may be provided as extending outwardly from the end surfaces 34 about the entirety or a portion of the outer perimeter, referenced at 42, of the shield 10 which is defined by the exterior walls thereof.

As is to be described in greater detail hereinafter, the second section 14 may be molded or otherwise formed in one or more pieces of an electrically-conductively composite material which may be the same or different in each piece. Such material may be formulated, as may be more fully described in U.S. Pat. Nos. 5,397,608; 5,366,664; 5,213,889; 5,137,766; 5,019,450; 4,973,514; 4,816,184; 4,664,971; and 4,559,262, and in WO 02/43456 and 02/02686, as a blend or other admixture of a resin, plastic, elastomeric, or other or other polymeric component, and an electrically-conductive, particulate filler component.

The polymeric component, which itself may be a blend or other admixture, may be a thermoplastic or thermoset, and specifically may be selected as depending upon one or more of operating temperature, hardness, chemical compatibility, resiliency, compliancy, compression-deflection, compression set, flexibility, ability to recover after deformation, modulus, tensile strength, elongation, force defection, flammability, or other chemical or physical property. Depending upon the application, suitable materials may include, particularly, polyurethanes, silicones, fluorosilicones, polycarbonates, ethylene vinyl acetates (EVA), acrylonitrile-butadiene-styrenes (ABS), polysulfones, acrylics, polyvinyl chlorides (PVC), polyphenylene ethers, polystyrenes, polyamides, nylons, polyolefins, poly(ether ether ketones), polyimides, polyetherimides, polybutylene terephthalates, polyethylene terephthalates, fluoropolymers, polyesters, acetals, liquid crystal polymers, polymethylacrylates, polyphenylene oxides, polystyrenes, epoxies, phenolics, chlorosulfonates, polybutadienes, buna-N, butyls, neoprenes, nitriles, polyisoprenes, natural rubbers, and copolymer rubbers such as styrene-isoprene-styrenes (SIS), styrene-butadiene-styrenes (SBS), ethylene-propylenes (EPR), ethylene-propylene-diene monomers (EPDM), nitrile-butadienes (NBR), and styrene-butadienes (SBR), and copolymers and blends thereof. Any of the forgoing materials may be used unfoamed or, if required by the application, blown or otherwise chemically or physically processed into an open or closed cell foam.

The polymeric component generally may form a binder or other continuous or matrix phase within the material into which the electrically-conductive particulate filler may be dispersed as a discrete phase. The filler generally is included within the binder in a proportion sufficient to provide the level of electrical conductivity which is desired for the intended application. For most applications, a bulk or volume resistivity of not greater than about 1,000 $\Omega$-cm, and/or a surface resistance of not greater than about 1000 $\Omega$/sq., would be considered acceptable, and would translate to a filler loading which generally may be between about 5-95% by weight, based on the total volume or weight, as the case may be, of the compound.

In general, the filler may be of any shape, or combination of shapes, and is referred broadly herein as being "particulate," which should be understood to include solid or hollow spheres and microspheres, elastomeric balloons, flakes, platelets, fibers, rods, irregularly-shaped particles, fibers, which may be chopped or milled or whiskers, and powders. For many applications, the particle size or distribution of the filler, which may be a diameter, imputed diameter, length, or other dimension of the particulate typically will range from about 0.01 mil (0.25 μm) to about 10 mils (250 μm) for powders, and from about 0.004 inch (0.1 mm) to about 1 inch (25 mm) for fibers.

Suitable electrically-conductive fillers include: nonmetals such as carbon, graphite, and inherently, i.e., intrinsically, conductive polymers; noble and non-noble metals such as gold, silver, nickel, copper, tin, aluminum, and nickel; noble or non-noble metal-plated, clad, metallized, or otherwise coated noble and non-noble metals such as gold or silver-plated copper, nickel, or aluminum, and tin or nickel-plated copper, silver, bismuth, indium, and lead; noble or non-noble metal coated non-metals such as gold, silver and/or nickel-plated or clad graphite, i.e., gold plated nickel clad graphite, glass, ceramics, plastics, elastomers, and mica; non-metal coated metal and non-metals; and combinations and mixtures thereof. The electrically-conductive filler specifically may be selected as depending upon one or more of conductivity, resin demand, hardness, chemical compatibility, such as with the polymeric component, and cost. In the case of a coating, the coating may be formed of one or more layers of the same material, or of layers of different materials.

Additional fillers and additives may be included in the formulation of the material depending upon the requirements of the particular application envisioned. Such fillers and additives, which may be functional or inert, may include wetting agents or surfactants, pigments, dispersants, dyes, and other colorants, opacifying agents, foaming or anti-foaming agents, anti-static agents, coupling agents such as titanates, chain extending oils, tackifiers, flow modifiers, pigments, lubricants such as molybdenum disulfide ($MoS_2$), silanes, peroxides, film-reinforcing polymers and other agents, stabilizers, emulsifiers, antioxidants, thickeners, and/or flame retardants and other fillers such as aluminum trihydrate, antimony trioxide, metal oxides and salts, intercalated graphite particles, phosphate esters, decabromodiphenyl oxide, borates, phosphates, halogenated compounds, glass, silica, which may be fumed or crystalline, silicates, mica, ceramics, and glass or polymeric microspheres. Typically, these fillers and additives are blended or otherwise admixed with the formulation or with the polymer component thereof, and may comprise between about 0.05-80% or more by total volume of the formulation.

The formulation for the electrically-conductive composite material of the second section 14 may be compounded in a conventional mixing apparatus as an admixture of the polymer and filler components, and any additional fillers or additives. Alternatively, and as may be further described in U.S. Pat. Nos. 5,397,608; 5,366,664; 5,213,889; 5,137,766; 5,019,450; 4,973,514; 4,816,184; 4,664,971; and 4,559,262, and in WO 02/43456 and 02/02686, the material may be provided in the form of pellets having a core of nickel-coated carbon or graphite fibers, or other conductive fibers, which are wire-die or otherwise coated or encased within an outer coating of the polymer component which may be a thermoplastic. Such pellets may be injection molded to form the second section 14.

Figure 4:
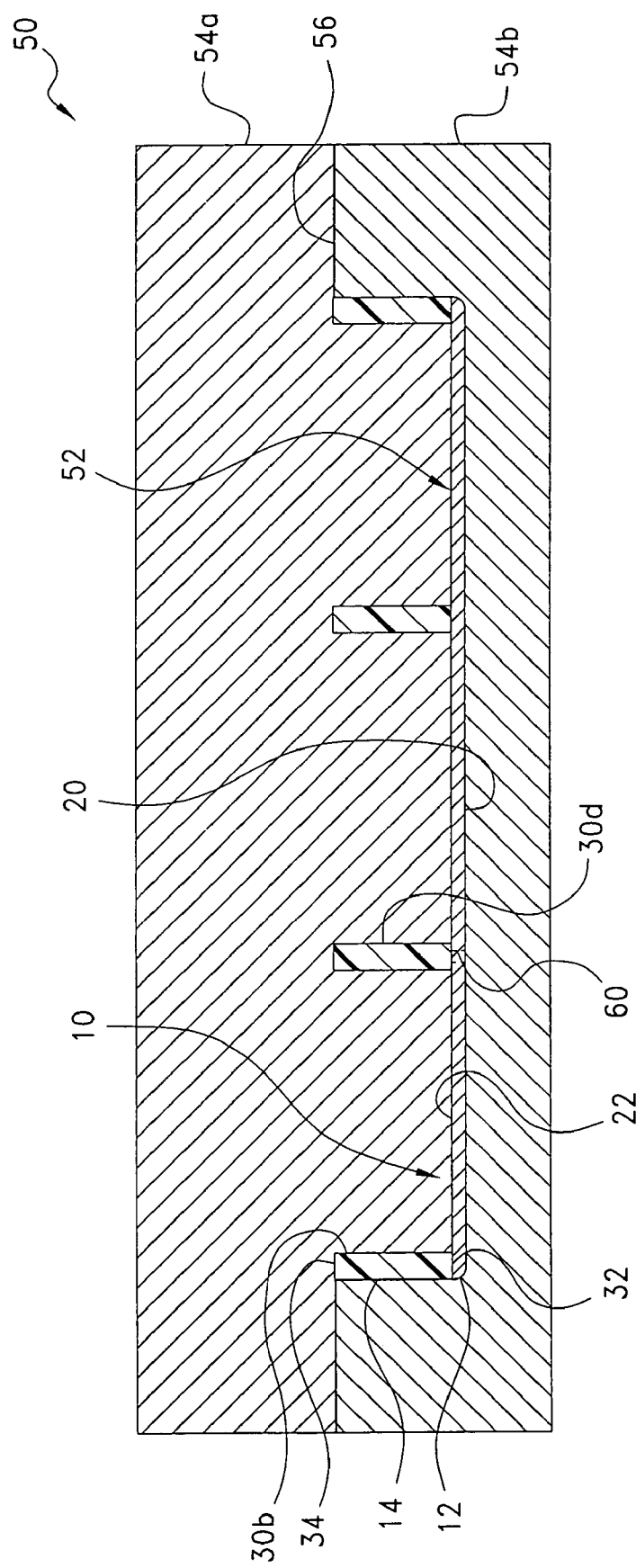
FIG. 4 is a cross-sectional, somewhat schematic view of an insert molding method for the manufacture of the shield of FIG. 1.

For example, the above-described pellets, or other compound of the electrically-conductively composite material, may be used in an insert molding process to both form the second section 14 and to join the section to the first section 12. Such process is schematically illustrated at 50 in the view of FIG. 4. In such process, the stamping or other form of the first section 12 may be positioned into a cavity, 52, defined between or formed into one of a pair of mold halves, 54a-b, with the remainder of the cavity 52 defining the configuration of the second section 14. With the mold halves 54 closed, such as along the parting line which is shown at 56, the compound of the composite material may be introduced under pressure or otherwise into the remainder of the cavity. Upon the cooling or other hardening or curing of the material, such as polymerization, cross-linking, further cross-linking or polymerizing, vulcanizing, drying, or other chemical or physical process, the mold halves 54 may be opened and the finished or substantially finished shield 10 thereby formed may be released therefrom.

Advantageously, by means of such insert molding or other process, the second section 14 of the shield 10 may be molded and bonded or otherwise joined to the first section 12 in a single operation. In this regard, and with reference now again to the several views of FIGS. 1-3, it may be seen, particularly in the cross-sectional view of 3, that the second section may be joined to the first section 12 along the interface 36. Although it is envisioned that the respective sections 12 and 14 may be constructed as separated parts which are mechanically fastened or interferingly or otherwise engaged, or adhesively bonded or otherwise joined, the sections 12 and 14 are shown in the illustrative embodiment to be self-adherent or bonded. Such bonding may be via mechanical forces, fusion or chemical bonding, and/or electrostatic, van der Waals, or other valance or attractive forces, as may depend upon the composition and the compatibility of the metal and plastic materials forming the sections 12 and 14. To facilitate such bonding, such as by increasing the surface area between the sections, or by developing additional mechanical or interlocking engagements, the metal sheet of the first section 12 may be stamped, cut, or otherwise formed as having one or more apertures, one of which is referenced in phantom at 60 in FIGS. 3 and 4, for the flow therethrough of the composite material of the second section 14. The metal sheet of the first section 12 also may be fabricated as having fingers, flanges, or other features into or around which the material of the second section 14 may flow.

Figure 5:
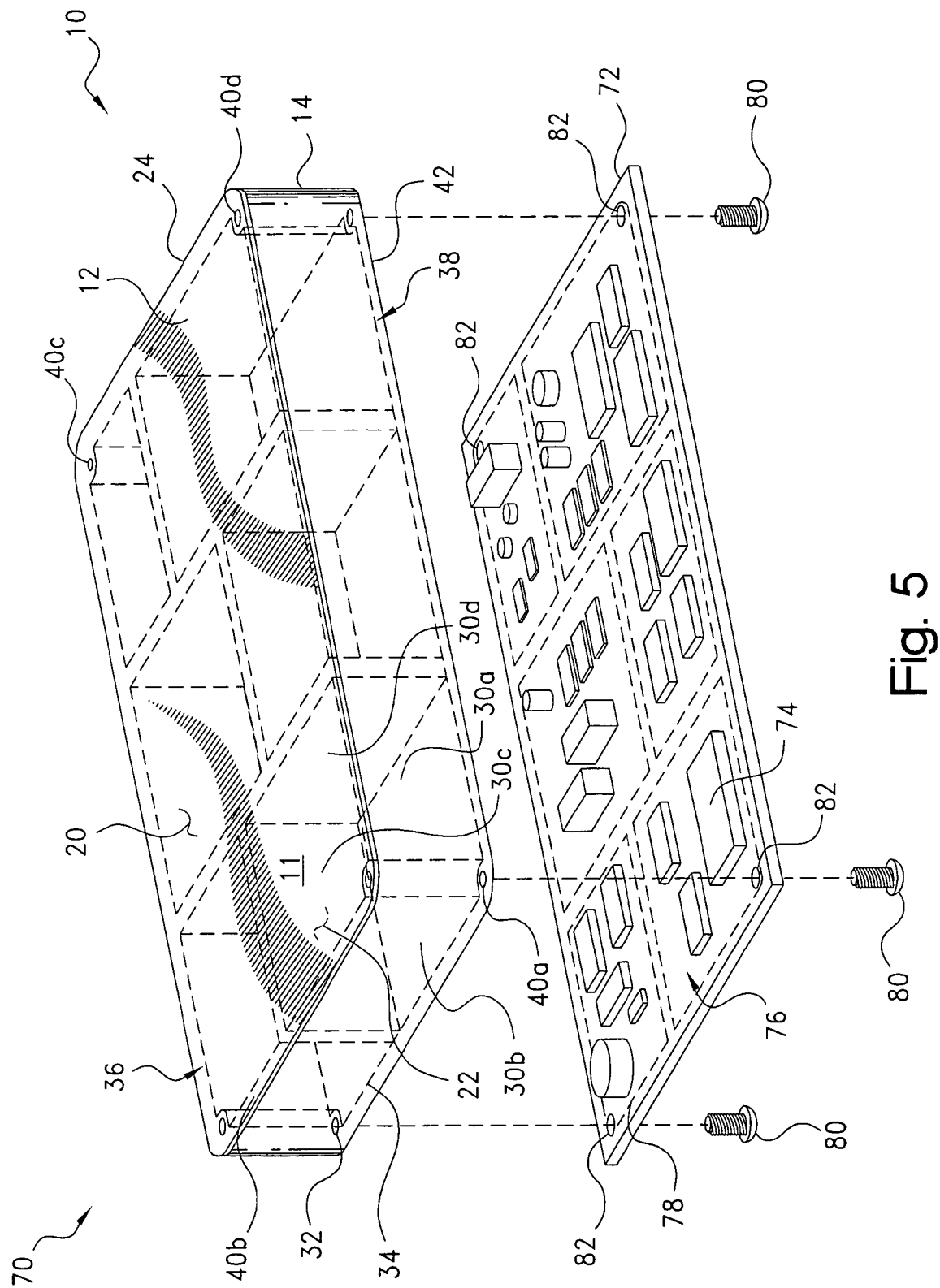
FIG. 5 is an exploded assembly view showing a representative printed circuit board (PCB) shielding application for the shield of FIG. 1.

Turning now to FIG. 5, an assembly incorporating the shield 10 of the invention is referenced generally at 70 in the exploded view of the figure. For purposes of illustration, the assembly 70 is shown to include a PCB, 72, which may be a component or module of an electronic device. As is shown, various electronic components, one of which is referenced at 74, or other circuitry may be mounted on the PCB 72, and may be grouped into different circuits, one of which is referenced at 76, such as may be delineated by the pattern of a ground trace, referenced in phantom at 78. The shield 10 may be attached or otherwise joined to the PCB 72 by means, for example, of the screws 80 received through the holes 82 of the PCB and into the throughholes 40 of the second section 14. Alternatively, the shield 10 may be attached or otherwise joined to the PCB 72 by other mechanical means, such as a clip, or by means of bonding with a metal solder or with an adhesive which may be electrically-conductive, or a double-sided tape.

Figure 6:
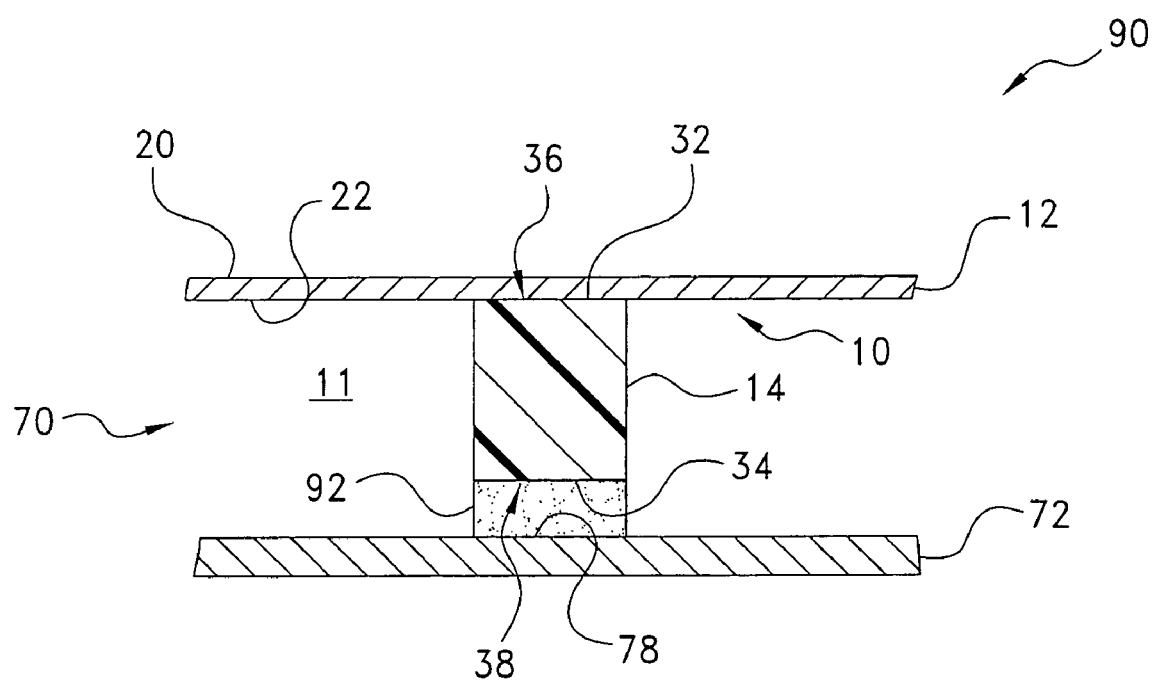
FIG. 6 is a magnified view of a cross-section of FIG. 4 showing the interface between the shield and the PCB in enhanced detail.

As joined to the PCB 72, the interface 38, or a portion thereof, may be in alignment and electrical contact with the ground trace 78 to thereby isolate one or more, or each, of the circuits 76 from the other circuits 76 or from other components within the device, or from other devices. In this regard, and with reference now to the magnified view of a cross-section of the completed assembly 70 which is shown at 90 in FIG. 6, electrical contact between the interface 38 and the ground trace 78 or other part of the device may be enhanced by means of a separate layer, 92, of an electrically-conductive material interposed between the interface and the trace. Depending upon the requirements of the application, such layer 82 may be provided to extend continuously or discontinuously between all or a portion of the interfacing surfaces 38 and 78, and additionally may provide an environmental seal therebetween. The layer 92 may be the solder or adhesive which may be used to bond the shield 10 to the PCB 72, or the layer may be an other coating such as a metal or a metal-filled paint which may be applied to one or both of the interfacing surfaces 38 and 78 such as by flame or arc-wire spraying, dipping, painting, screen or transfer printing, dispensing, extrusion, cladding, metallizing, laminating, electroless or electrolytic plating, vacuum or chemical vapor deposition, evaporation, sputterring, plasma coating, or the like.

Alternatively, the layer may be electrically-conductive gasket or gasket-like material. In this regard, such material may be provided in the form of a gasket having a resilient core element affording gap-filling capabilities, which core element may be loaded, sheathed, or coated with an electrically conductive element. The resilient core element, which may be foamed or unfoamed, solid or tubular, typically may be molded, extruded, die-cut, or otherwise formed of an elastomeric thermoplastic material such as a polyolefin, polyvinyl chloride, or a polypropylene-EPDM blend, or a thermoplastic or thermosetting rubber such as a butadiene, styrene-butadiene, nitrile, chlorosulfonate, neoprene, urethane, silicone, or fluorosilicone.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Other conductive particles and fibers such as carbon, graphite, plated glass, or a conductive polymer material may be substituted. The gasket, alternatively, may be provided to be of an all-metal, knitted wire construction, or as a over-molded or formed-in-place (FIP) bead of a curable, electrically-conductive silicone or urethane composition. As to an FIP construction, the composition may be dispensed in a fluent state onto one or the other of the surfaces 38 and 78, and then cured or foamed in situ via the application of heat or with atmospheric moisture, UV, radiation, or other energy sources.

Means of securing the gasket or gasket material to one or the other of the surfaces 38 and 78 include pressure-sensitive adhesive tapes or other layers (not shown), which may be filled to be electrically conductive, interposed between the surface and the gasket. Alternatively, mechanical means of attachment such as clips, fasteners, or a tough-in-groove or other interference fit may be employed. In the case of an over-molded or FIP construction, the gasket may be self-bonded by chemical, mechanical, or other adhesive forces to the surface. EMI shielding gaskets and their methods of manufacture and use are further described in U.S. Pat. Nos. 6,121,545; 6,096,413; 5,910,524; 5,882,729; 5,731,541; 5,641,438; 5,603,514; 5,578,790; 5,566,055; 5,524,908; 5,522,602; 5,512,709; 5,438,423; 5,202,536; 5,142,101; 5,115,104; 5,107,070; 5,105,056; 5,068,493; 5,028,739; 5,008,485; 4,988,550; 4,968,854; 4,952,448; 4,857,668; and 3,758,123, and in WO 96/22672 and 98/54942; Japanese Patent Publication (Kokai) No. 7177/1993; DE 19728839, and Severinsen, J., "Gaskets That Block EMI," Machine Design, Vol. 47, No. 19, pp. 74-77 (Aug. 7, 1975).

As it is anticipated that certain changes may be made in the present invention without departing from the precepts herein involved, it is intended that all matter contained in the foregoing description shall be interpreted as illustrative and not in a limiting sense. All references including any priority documents cited herein are expressly incorporated by reference.

What is claimed is:

1. An EMI shield having at least one compartment for enclosing circuitry of an electronic device, said shield comprising:
   a first member formed of a thin metal sheet; and
   a second member formed of an electrically-conductive composite material comprising an admixture of a polymeric component and an electrically-conductive particulate filler component, the second member being integrally joined to the first member, and having at least one wall which extends from the first member and which together with the first member defines at least a portion of said compartment.

2. The shield of claim 1 wherein the polymeric component comprises one or more thermosetting or thermoplastic polymers or co-polymers, or a blend thereof.

3. The shield of claim 1 wherein the polymeric component is selected from the group consisting of epoxies, phenolics, poly(ether ether ketones), polyimides, polyolefins, polyetherimides, polybutylene terephthalates, polyethylene terephthalates, nylons, polyamides, fluoropolymers, polysulfones, polyesters, acetal homo and copolymers, liquid crystal polymers, polyacrylics, polymethylacrylates, poly(ester and ether urethanes), polyurethanes, acrylonitrile-butadiene-styrene, polyvinyl chlorides, polyphenylene ethers, polyphenylene oxides, polystyrenes, polycarbonates, and copolymers and blends thereof.

4. The shield of claim 1 wherein the shield exhibits an EMI shielding effectiveness of at least about 60 dB substantially over a frequency range of between about 10 MHz and about 10 GHz.

5. The shield of claim 1 wherein the composite material has a volume resistivity of not greater than about 1,000 Ω-cm.

6. The shield of claim 1 wherein the composite material comprises between about 5-95% by weight of the filler component.

7. The shield of claim 1 wherein the metal sheet has a thickness of not greater than about 10 mils (0.125 mm).

8. The shield of claim 1 wherein the wall of the second member has a thickness of between about 3-10 mil (0.075-0.254 mm).

9. The shield of claim 1 wherein the second member is self-bonded to the first member.

10. The shield of claim 1 wherein the sheet is formed of aluminum, zinc, magnesium, steel, or a combination or alloy thereof.

11. The shield of claim 1 wherein the wall extends from the first member to an end surface, the end surface being disposable on a part of the device.

12. The shield of claim 11 further comprising an electrically-conductive layer or gasket disposed on the end surface.

13. The shield of claim 12 wherein the electrically-conductive layer comprises a metal or a resin filled with electrically-conductive particulates.

14. The shield of claim 12 wherein the gasket comprises an elastomeric resin filed with electrically-conductive particulates.

15. The shield of claim 12 wherein the gasket or layer is self-adherent on the end surface.

16. The shield of claim 1 wherein the electrically-conductive particulate filler component comprises electrically-conductive fibers.

17. The shield of claim 16 wherein the electrically-conductive fibers are selected from the group consisting of: graphite, carbon, inherently-conductive polymer, and metal fibers; metal or non-metal fibers having an electrically-conductive coating; and mixtures and combinations thereof.

18. The shield of claim 17 wherein the electrically-conductive coating comprises one or more layers of carbon, graphite, or one or more inherently-conductive polymers or metals, or a combination thereof.

19. The shield of claim 16 wherein the fibers have an average length of between about 0.004-1 inch (0.1-25 mm).

20. An assembly for the EMI shielding of circuitry of an electronic device, the assembly comprising:
   an EMI shield having at least one compartment, the shield comprising:
      a first member formed of a thin metal sheet; and
      a second member formed of an electrically-conductive composite material comprising an admixture of a polymeric component and an electrically-conductive particulate filler component, the second member being integrally joined to the first member, and having at least one wall which extends from the first member and which together with the first member defines at least a portion of said compartment, the compartment being received over the circuitry of the device.

21. The assembly of claim 20 wherein the polymeric component comprises one or more thermosetting or thermoplastic polymers or co-polymers, or a blend thereof.

22. The assembly of claim 20 wherein the polymeric component is selected from the group consisting of epoxies, phenolics, poly(ether ether ketones), polyimides, polyolefins, polyetherimides, polybutylene terephthalates, polyethylene terephthalates, nylons, polyamides, fluoropolymers, polysulfones, polyesters, acetal homo and copolymers, liquid crystal polymers, polyacrylics, polymethylacrylates, poly(ester and ether urethanes), polyurethanes, acrylonitrile-butadiene-styrene, polyvinyl chlorides, polyphenylene ethers, polyphenylene oxides, polystyrenes, polycarbonates, and copolymers and blends thereof.

23. The assembly of claim 20 wherein the shield exhibits an EMI shielding effectiveness of at least about 60 dB substantially over a frequency range of between about 10 MHz and about 10 GHz.

24. The assembly of claim 20 wherein the composite material has a volume resistivity of not greater than about 1,000 Ω-cm.

25. The assembly of claim 20 wherein the composite material comprises between about 5-95% by weight of the filler component.

26. The assembly of claim 20 wherein the metal sheet has a thickness of not greater than about 10 mils (0.125 mm).

27. The assembly of claim 20 wherein the wall of the second member has a thickness of between about 3-10 inch (0.075-0.254 mm).

28. The assembly of claim 20 wherein the second member is self-bonded to the first member.

29. The assembly of claim 20 wherein the sheet is formed of aluminum, zinc, magnesium, steel, or a combination or alloy thereof.

30. The assembly of claim 20 wherein the wall extends from the first member to an end surface, the end surface being disposed on a part of the device which together with the compartment encloses the circuitry.

31. The assembly of claim 30 further comprising an electrically-conductive layer or gasket interposed between the end surface and the device part.

32. The assembly of claim 31 wherein the electrically-conductive layer comprises a metal or a resin filled with electrically-conductive particulates.

33. The assembly of claim 31 wherein the gasket comprises an elastomeric resin filed with electrically-conductive particulates.

34. The assembly of claim 31 wherein the gasket or layer is self-adherent on the end surface.

35. The assembly of claim 20 wherein the electrically-conductive particulate filler component comprises electrically-conductive fibers.

36. The assembly of claim 35 wherein the electrically-conductive fibers are selected from the group consisting of: graphite, carbon, inherently-conductive polymer, and metal fibers; metal or non-metal fibers having an electrically-conductive coating; and mixtures and combinations thereof.

37. The assembly of claim 36 wherein the electrically-conductive coating comprises one or more layers of carbon, graphite, or one or more inherently-conductive polymers or metals, or a combination thereof.

38. The assembly of claim 35 wherein the fibers have an average length of between about 0.004-1 inch (0.1-25 mm).

* * * * *